United States Patent
Siddiqi et al.

(10) Patent No.: US 10,678,287 B2
(45) Date of Patent: Jun. 9, 2020

(54) POSITIVE AND NEGATIVE FULL-RANGE BACK-BIAS GENERATOR CIRCUIT STRUCTURE

(71) Applicant: GLOBALFOUNDRIES INC., Grand Cayman (KY)

(72) Inventors: Arif A. Siddiqi, Milpitas, CA (US); Juhan Kim, Santa Clara, CA (US); Mahbub Rashed, Cupertino, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 54 days.

(21) Appl. No.: 16/159,831

(22) Filed: Oct. 15, 2018

(65) Prior Publication Data

US 2020/0117226 A1 Apr. 16, 2020

(51) Int. Cl.
*G11C 5/14* (2006.01)
*G05F 3/20* (2006.01)

(52) U.S. Cl.
CPC .............. *G05F 3/205* (2013.01); *G11C 5/146* (2013.01)

(58) Field of Classification Search
None
See application file for complete search history.

(56) References Cited

U.S. PATENT DOCUMENTS

| 4,794,278 A | 12/1988 | Vajdic |
| 4,920,280 A | 4/1990 | Cho et al. |
| 5,184,030 A | 2/1993 | Chung et al. |
| 5,282,170 A | 1/1994 | Van Buskirk et al. |
| 6,031,778 A * | 2/2000 | Makino ............ G11C 7/00 365/226 |
| 7,598,795 B2 | 10/2009 | Lee et al. |

* cited by examiner

*Primary Examiner* — Jas A Sanghera
(74) *Attorney, Agent, or Firm* — David Cain; Hoffman Warnick LLC (57) ABSTRACT

Embodiments of the disclosure provide a circuit structure for producing a full range biasing voltage including: a logic control node; first and second voltage generators, coupled to the logic control node, the first and second voltage generators configured to generate a positive voltage output at a positive voltage node and a negative voltage output at a negative voltage node; first and second multiplexer cells, coupled to the logic control node, configured to multiplex the positive voltage level received from the first or the second positive voltage node and the negative voltage level received from the first or the second negative voltage node to provide a multiplexed output; and an output node coupled to each of the first multiplexer cell and the second multiplexer cell configured to receive the multiplexed output to provide a biasing voltage range to at least one transistor having a back-gate terminal.

19 Claims, 7 Drawing Sheets

POSITIVE AND NEGATIVE FULL-RANGE BACK-BIAS GENERATOR CIRCUIT STRUCTURE

TECHNICAL FIELD

Embodiments of the disclosure relate generally to providing a back-bias generator capable of providing a full range of positive and negative voltages through a single output node allowing transistors having back gate terminals to operate in forward back-bias and reverse back-bias simultaneously.

BACKGROUND

Transistors are critical components for implementing digital and analog circuit designs. Generally a MOS transistor has four electrical terminals: source, drain, gate, and the back-gate, also known as the body terminal. As the study of electronics has advanced, there has been an effort on implementing a Power, Performance and Area (PPA) technique that focuses on reducing the physical area and power consumption of a design while maintaining or improving performance specifications such as speed or frequency of operation. As a result, there is increased emphasis on reducing the channel length of a MOS transistor, which helps in improving the PPA of the design. Another way of improving the PPA is by applying a voltage at the back-gate terminal of the transistor.

Threshold voltage is defined as the minimum amount of voltage difference needed between the gate and source terminal of a transistor that allows an electric current to flow through the drain-source channel. In other words, as the gate to source voltage becomes equal to or greater than the threshold voltage, the transistor is said to be turned on (enabled) and current starts flowing through the channel. When the gate to source voltage drops below the threshold voltage, the transistor turns off (disabled) and ideally no current can flow through the channel. However, there may be some leakage or stand-by current flowing even when the transistor is off and this may be considered as an undesirable condition in most cases. It is well-known that any change in the threshold voltage has an impact on the PPA of the transistor device. For example, if the threshold voltage becomes smaller, the transistor can operate with smaller gate to source voltage, which may help in reducing power consumption. Also, reducing the threshold voltage helps in increasing the drive strength and frequency of the operation of the transistor, which may result in a smaller transistor device. Alternatively, increasing the threshold voltage may help in reducing the leakage or stand-by current during inactive or power-down mode.

The value of the threshold voltage is dependent on several factors. One of the factors that can decrease or increase the value of the threshold voltage is the amount of voltage applied at the back-gate terminal. The type of action in which threshold voltage is reduced by application of back-bias voltage is called forward back-biasing (FBB). Conversely, the type of action that causes the threshold voltage to increase by the application of back-bias voltage is called reverse back-biasing (RBB). Transistors having a back-gate terminal include silicon-on-insulator (SOI), such as fully depleted SOI (FD-SOI) transistors, bulk planar transistors, FinFet transistors, nanosheet transistors, and vertical transistors, to name a few. FD-SOI transistors are well-suited for such applications due to the possibility of applying full range (both positive and negative) back-bias voltage. This is due to the fact that for FD-SOI transistor, the forward and reverse back-bias voltage maximum upper range is limited only by the breakdown voltage of the reverse biased parasitic substrate diodes. This range may reach around 2-4 or higher times the maximum rated supply voltage at which the transistor device can normally operate. This maximum upper limit is much higher than many other MOS transistor types, e.g., bulk planar or FinFet transistors as their upper range is restricted in order to avoid their reverse-biased parasitic (source or drain) diffusion layer diodes becoming forward-biased. As a result, the potential variation in threshold voltage in the FD-SOI transistor type can be much higher as compared to the other MOS transistor device types. While this variation in threshold voltage is desirable and in some extreme cases, it may result in zero or twice the threshold voltage value. However, most back-gate biasing applications may need a smaller back-gate biasing voltage range that may be well below the maximum allowed upper limit, e.g., a back-gate biasing range from about −1.8V to about 1.8V may be enough for most applications. There are various approaches currently existing that attempt to supply transistors with the required voltages and properly bias transistors having back-gates.

SUMMARY

A first aspect of the present disclosure provides a circuit structure for producing a full range biasing voltage, the circuit structure including: a logic control node; a first voltage generator and a second voltage generator, coupled to the logic control node, the first voltage generator configured to generate a positive voltage output at a first positive voltage node and a negative voltage output at a first negative voltage node, the second voltage generator configured to generate a positive voltage output at a second positive voltage node and a negative voltage output at a second negative voltage node; a first multiplexer cell and a second multiplexer cell, coupled to the logic control node, wherein the first and the second multiplexer cells are configured to multiplex the positive voltage level received from the first or the second positive voltage node and the negative voltage level received from the first or the second negative voltage node to provide a multiplexed output; an output node coupled to the first multiplexer cell and configured to receive the multiplexed output to provide a biasing voltage range to at least one transistor having a back-gate terminal; an output node coupled to the second multiplexer cell and configured to receive the multiplexed output to provide a biasing voltage range to at least one transistor having a back-gate terminal; and a digital-to-analog converter (DAC) coupled to the logic control node and configured to logically control the first and the second voltage generators and the first and the second multiplexer cells to produce the biasing voltage range.

A second aspect of the present disclosure provides a method of producing a full range biasing voltage including: generating a positive and a negative voltage from first and second voltage generators, wherein the first and second voltage generators are each coupled to a logic control node, a positive voltage node, and a negative voltage node; using first and second multiplexer cells coupled to the logic control node, multiplexing the positive voltage available from the positive voltage node and the negative voltage available from the negative voltage node to produce a multiplexed output; coupling an output node to the first multiplexer cell to receive the multiplexed output to provide the biasing voltage range to at least one transistor having a back-gate terminal; coupling an output node to the second multiplexer cell to receive the multiplexed output to provide the biasing voltage range to at least one transistor having a back-gate terminal; and logically controlling the first and the second voltage generators and the first and the second multiplexer cells with a digital-to-analog converter (DAC) coupled to the logic control node to produce the biasing voltage range.

A third aspect of the present disclosure provides a circuit structure for producing a full range biasing voltage, the circuit structure including: a logic control node; a first voltage generator and a second voltage generator, coupled to the logic control node, the first voltage generator configured to generate a positive voltage output at a first positive voltage node and a negative voltage output at a first negative voltage node, the second voltage generator configured to generate a positive voltage output at a second positive voltage node and a negative voltage output at a second negative voltage node; a first multiplexer cell and a second multiplexer cell, coupled to the logic control node, wherein the first and the second multiplexer cells are configured to multiplex the positive voltage level received from the first or the second positive voltage node and the negative voltage level received from the first or the second negative voltage node to provide a multiplexed output; a first output node coupled to the first and the second multiplexer cells and configured to receive the multiplexed output to provide the biasing voltage range to at least one transistor having a back-gate terminal; a second output node coupled to the first and the second multiplexer cell and configured to receive the multiplexed output to provide the biasing voltage range to at least one transistor having a back-gate terminal; and a logic control digital-to-analog converter (DAC) coupled to the logic control node and configured to logically control the first voltage generator, the second voltage generator, the first multiplexer cell, and the second multiplexer cell, to produce the biasing voltage range at each the first output node and the second output node.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

The following description describes various embodiments relating to back-gate bias generator circuit structures used to generate back-gate biasing voltages. Such back-gate biasing voltages may range, for example, from about −1.8V to about 1.8V, and can be used to bias transistors having back-gate terminals, such as fully-depleted silicon-on-insulator (FD-SOI) transistors. While FD-SOI transistors are specifically referred to throughout the disclosure, it is understood that other transistors that are configured to provide a back-gate terminal to adjust the threshold voltage, such as FinFet transistors, bulk planar transistors, nanosheet transistors, vertical transistors, and/or one or more other currently-known or later developed transistor structures, may be used, even though the back-gate biasing voltage range may be limited.

Figure 7:
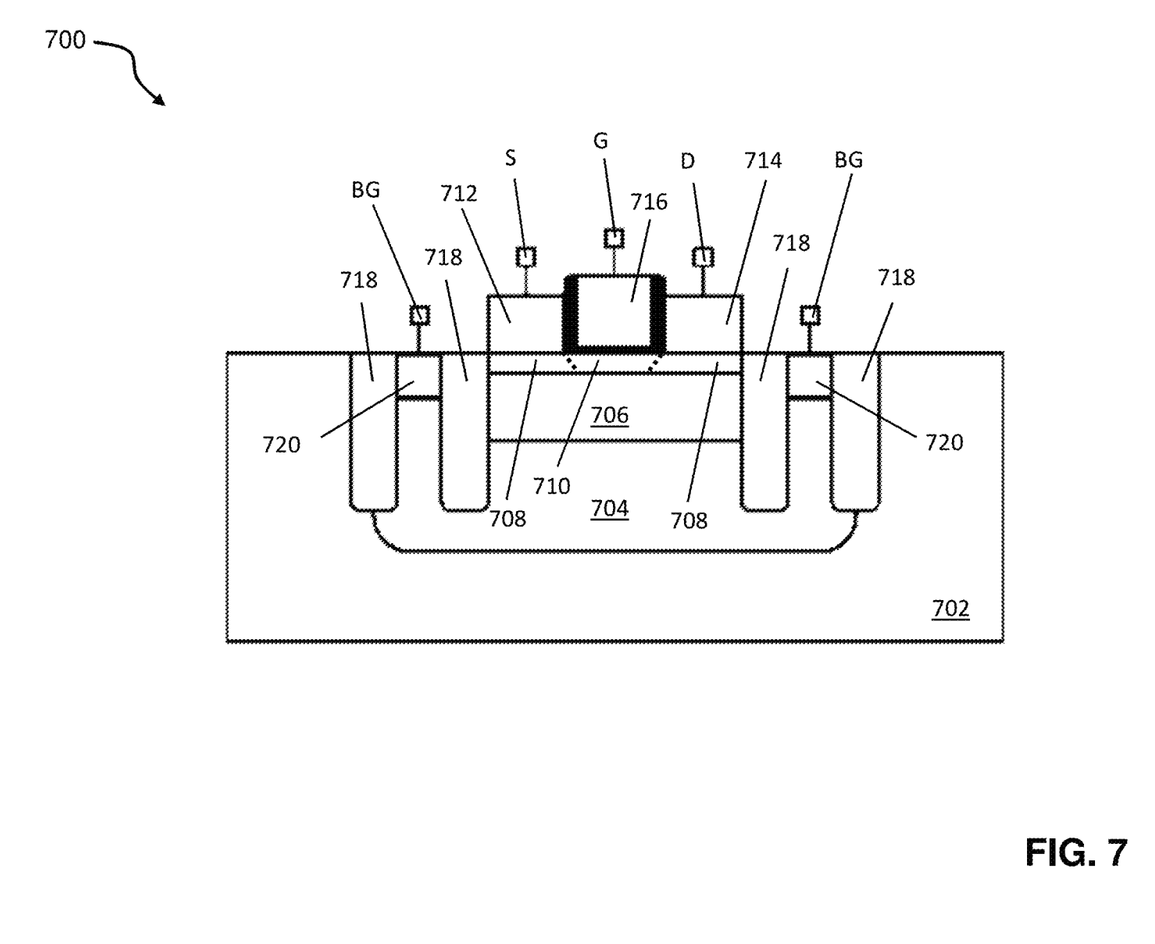
FIG. 7 shows a cross-sectional view of a fully depleted SOI (FDSOI) transistor structure with a back-gate region beneath a buried oxide (BOX) layer according to embodiments of the disclosure.

FIG. 7 shows a cross-sectional view of a fully depleted SOI (FDSOI) transistor structure 700 with a back-gate region beneath a buried oxide (BOX) layer according to embodiments of the disclosure. FDSOI transistor 700 can be formed with structural features for reducing the electrical resistance and capacitance across source and drain nodes S, D. FDSOI transistor 700 and components thereof can be formed on and within a substrate 702. A back-gate region 704, alternatively identified as an n-type or p-typed doped well region, of substrate 702 can be implanted or formed in-situ during deposition with one or more doping compounds to change the electrical properties. A buried insulator layer 706, also known in the art as a "buried oxide" or "BOX" layer, separates back-gate region 704 of substrate 702 from source/drain and channel regions 708, 710 of FDSOI transistor 700.

Source/drain regions 708 and channel region 710 may electrically couple a source terminal 712 of FDSOI transistor 700 to a drain terminal 714 of FDSOI transistor 700 when the transistor is in an on state. A gate stack 716 can be positioned over channel region 710, such that a voltage of gate node G controls the electrical conductivity between source and drain terminals 712, 714 through source/drain regions 708 and channel region 710. A group of trench isolations 718, in addition, can electrically and physically separate the various regions of FDSOI transistor 700 from parts of other transistors.

Back-gate region 704 can be electrically coupled to back-gate node BG through back-gate terminals 720 within substrate 702 to further influence the characteristics of transistor 700, e.g., the conductivity between source and drain terminals 712, 714 through source/drain regions 708 and channel region 710. Applying an electrical potential to back-gate terminals 720 at back-gate node BG changes the threshold voltage of the transistor 700.

While most transistors have a gate terminal, source terminal, drain terminal, and channel, FD-SOI transistors have a buried oxide layer as described above, acting as an ultra-thin layer of insulator, and a very thin silicon film instead of a traditional transistor channel. Using a very thin silicon film eliminates the need for traditional channel doping and increases uniformity between FD-SOI devices. The buried oxide layer lowers the parasitic capacitance between the source and drain terminals, but also confines the current, allowing it only to flow from drain to source for an NMOS device or source to drain for a PMOS device, which may help in reducing leakage current. While traditional transistors may only be controlled through voltages applied to gate terminals, FD-SOI transistors may also be controlled by applying a voltage to a back-gate terminal. The back-gate terminal is formed when a voltage is applied to the substrate below the transistor device and the buried oxide layer. Back-gate biasing may be used to adjust the threshold voltage of the transistor. The threshold voltage is defined as the minimum voltage required between gate and source to activate or turn on the transistor. FD-SOI and other transistors having back-gates may have at least three types of operation: reverse back-gate biasing (RBB); normal operation; and forward back-gate biasing (FBB). During normal operation, the back-gate terminal is generally, in the case of an NMOS device, connected to the lowest available voltage or the NMOS source terminal. However, in the case of a PMOS device, the back-gate terminal is generally connected to the most positive voltage at which the device is allowed to operate or the PMOS source terminal. During normal operation, the threshold voltage is not changed by any external circumstances and the transistor operation is wholly determined by the voltages at the gate, drain, and source terminals.

During RBB, the threshold voltage is increased as a result of the applied back-gate voltage and the channel becomes less conductive, resulting in a lower amount of current flowing through the transistor. In order to compensate for the loss of conductivity, the gate voltage must be increased in order to allow current to flow through the channel. This increase in threshold voltage effectively increases the amount of gate voltage required to operate the transistor, which can be externally controlled by changing the back-bias voltage.

During FBB, the threshold voltage is reduced as a result of the applied back-gate voltage. This results in the channel becoming more conductive, requiring a much smaller gate voltage to turn on, which can also be externally controlled by changing the back-gate voltage. Other transistors having body or back-gate terminals can utilize back-gate biasing to lower or increase the threshold voltage, but are limited in the amount of biasing voltage accepted at the back-gate. As such, FD-SOI transistors and other similar transistor devices can not only operate at the gate with very low voltages, but can also operate in either normal operation, FBB, or RBB by simply varying the back-gate biasing voltage of the transistor. Transistor devices able to provide this functionality can offer a variety of different circuit applications. The following embodiment provides a circuit structure configured to generate a 'full range' of biasing voltages, ranging, for example, from about −1.8V to 1.8V, at a single output to provide forward and reverse back-gate biasing of transistor devices having a back-gate terminal. The following embodiments further provide for the fine-tuning of threshold voltage levels within the FBB and RBB operations.

Figure 1:
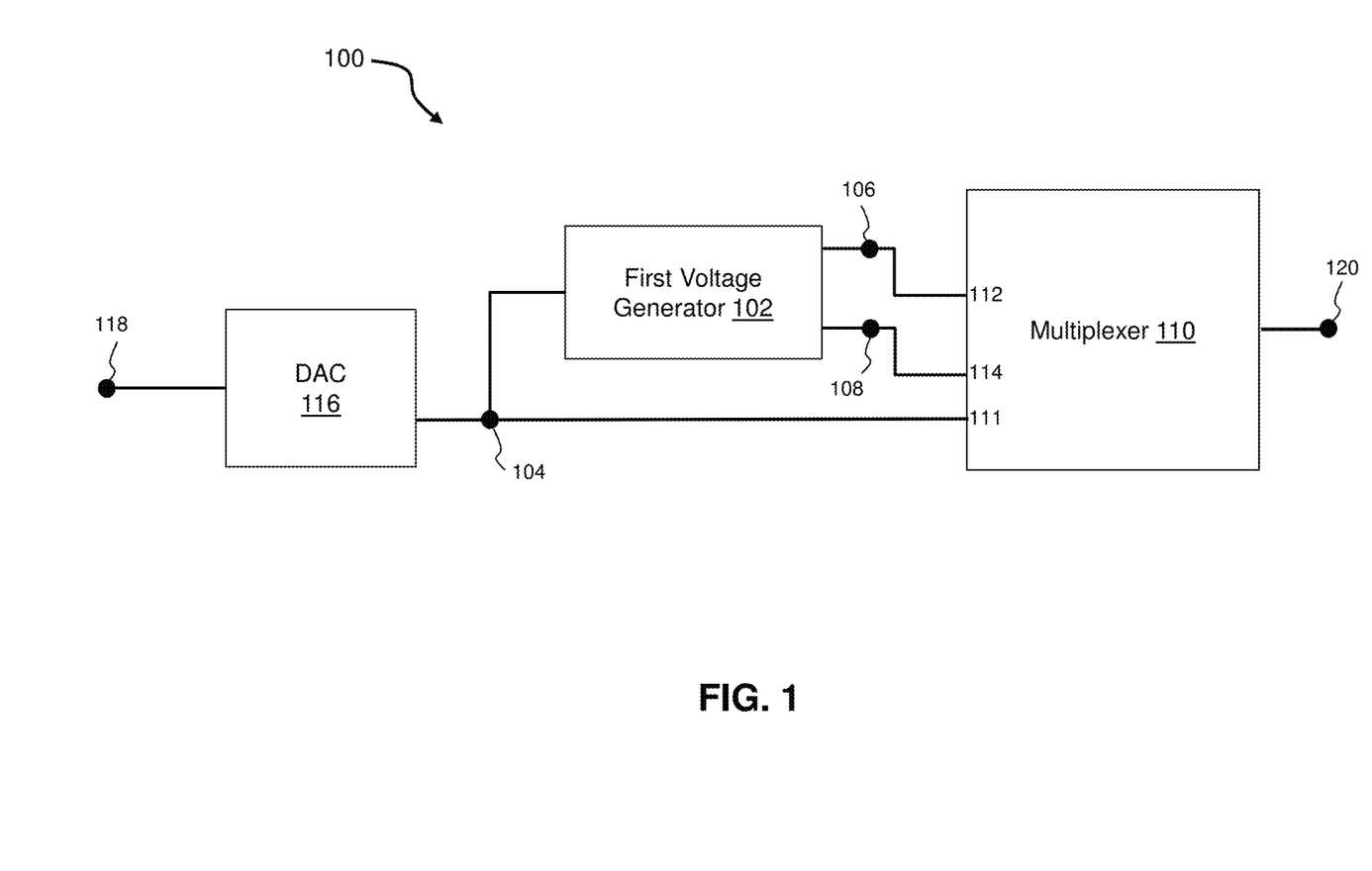
FIG. 1 shows a schematic view of an embodiment of a half range back-gate bias generator circuit structure according to embodiments.

Turning to FIG. 1, a first embodiment depicting a half range biasing voltage circuit structure 100 for producing a half range biasing voltage is shown. Circuit structure 100 generally illustrates a structure that is configured to produce a back-gate biasing voltage range from about −1.8V to 0V or about 0V to 1.8V at an output node 120. A first voltage generator 102, coupled to a logic control node 104, may be configured to generate both positive and negative voltages. The positive and negative voltages are independently supplied by the first voltage generator 102 to a positive voltage node 106 and negative voltage node 108, respectively.

FIG. 1 also illustrates a multiplexer cell 110. Multiplexer cell 110 may include a control input 111 coupled to logic control node 104, and may have a first input 112 coupled to positive voltage node 106 and a second input 114 coupled to negative voltage node 108. Multiplexer cell 110 is configured to multiplex the positive and negative voltages received via first and second inputs 112, 114 to yield an output voltage at output node 120. The voltage level at the output node 120 may range from about −1.8V to 0V or about 0V to 1.8V or any desired voltage range in between. Output node 120 may be a single output pin used to bias any circuit structures having at least one back-gate terminal. Multiplexer cell 110 and first voltage generator 102 may be further coupled to a digital-to-analog converter (DAC) 116 via control node 104. The DAC 116 receives an address input 118 and is configured to provide a logic control output to first voltage generator 102 and multiplexer cell 110. The positive and negative voltages at the positive and negative voltage nodes 106, 108 are monotonically updated to provide the desired half voltage range. The term monotonicity refers to DAC characteristics where the analog output, in this situation the voltage, may either increase or remain the same, but may never decrease.

Figure 2:
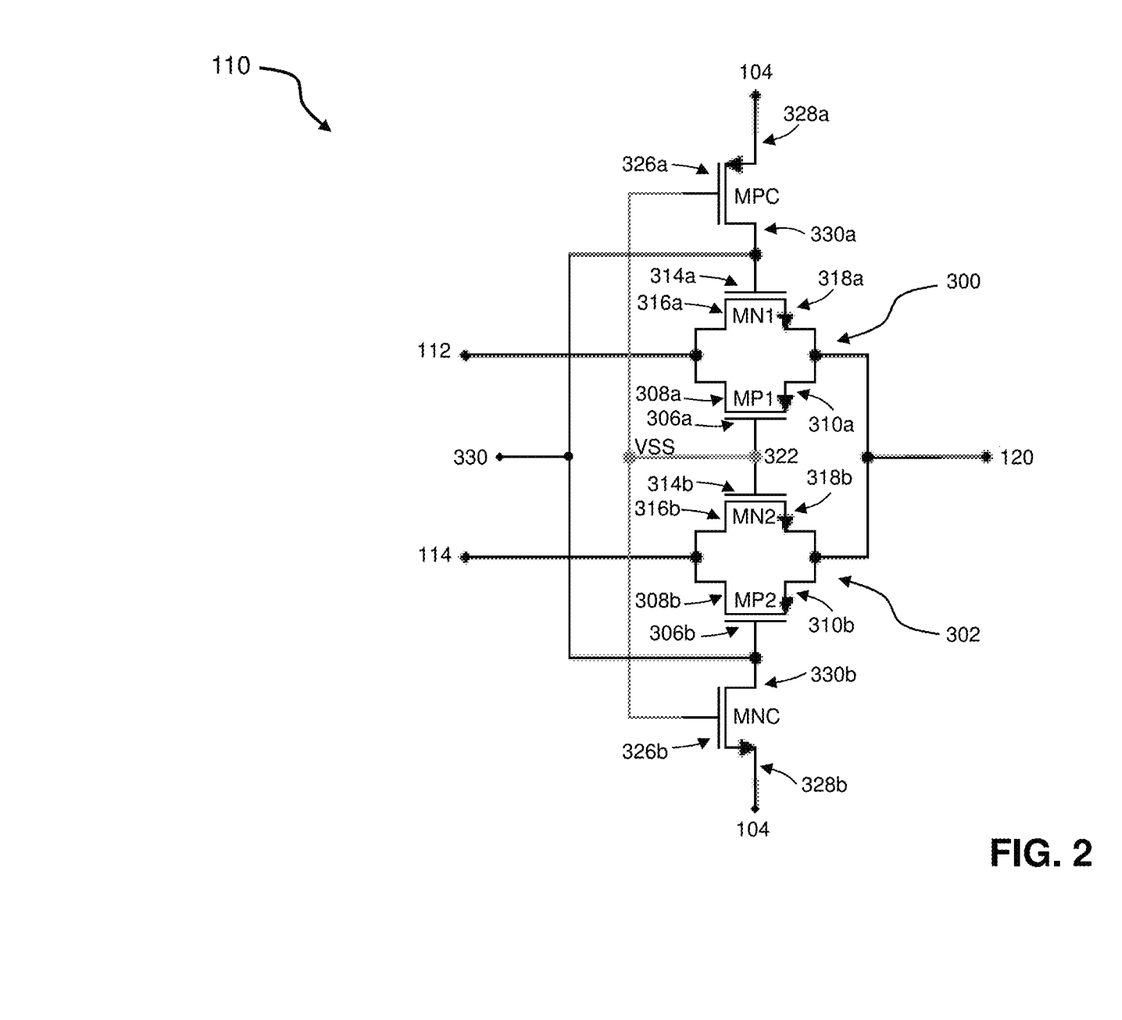
FIG. 2 shows a schematic view of a multiplexer cell circuit structure configured to multiplex a positive and negative voltage to a single voltage output according to embodiments.

Turning to FIG. 2, a schematic view of multiplexer cell 110 is shown. As described above, multiplexer cell 110 is configured to multiplex positive and negative voltages to a single output node 120.

Multiplexer cell 110 includes a first transmission gate device 300 and a second transmission gate device 302. The first transmission gate device 300 includes a p-channel transistor MP1 and an n-channel transistor MN1. The second transmission gate device 302 includes a p-channel transistor MP2 and an n-channel transistor MN2.

P-channel transistor MP1 of the first transmission gate device 300 includes gate terminal 306a, drain terminal 308a, and source terminal 310a. P-channel transistor MP2 of second transmission gate device 302 includes gate terminal 306b, drain terminal 308b, and source terminal 310b.

Each of the first and second transmission gate devices 300, 302 further includes an n-channel transistor MN1, MN2, respectively. N-channel transistor MN1 of first transmission gate device 300 includes gate terminal 314a, drain terminal 316a, and source terminal 318a, while n-channel transistor MN2 of second transmission gate device 302 includes gate terminal 314b, drain terminal 316b, and source terminal 318b. It should be noted that the drain and source terminals of a MOS transistor (e.g., MN1, MN2, MP1, MP2, etc.) are merely representative, and can easily be interchanged with one another without any loss of functionality of the transmission gate device.

According to embodiments, n-channel transistor MN1 and p-channel transistor MP1 of first transmission gate device 300 and n-channel transistor MN2 and p-channel transistors MP2 of second transmission gate device 302 are source coupled to the output node 120. Further, n-channel transistor MN1 and p-channel transistor MP1 of first transmission gate device 300 are drain coupled to first input 112, while n-channel transistor MN2 and p-channel transistor MP2 of second transmission gate device 302 are drain coupled to second input 114. P-channel transistor MP1 of first transmission gate device 300 and n-channel transistor MN2 of second transmission gate device 302 are gate coupled to a coupling node 322. N-channel transistor MN1 of first transmission gate device 300 and p-channel transistor MP2 of second transmission gate device 302 are gate coupled to a coupling node 330.

Multiplexer cell 110 of FIG. 2 further includes a p-channel radial transistor MPC with a gate terminal 326a, source terminal 328a, and drain terminal 330a, as well as an n-channel radial transistor MNC with a gate terminal 326b, source terminal 328b, and drain terminal 330b. Drain terminal 330a of p-channel transistor MPC is coupled to gate terminal 314a of n-channel transistor MN1 of first transmission gate device 300. Drain terminal 330b of n-channel transistor MNC is coupled to gate terminal 306b of p-channel transistor MP2 of second transmission gate device 302. Gate terminal 326a of p-channel transistor MPC and gate terminal 326b of n-channel transistor MNC are coupled to coupling node 322. Drain terminal 330a of p-channel transistor MPC and drain terminal 330b of n-channel transistor MNC are coupled to the coupling node 330. Coupling node 322 may also be coupled to VSS (e.g., ground terminal at 0V).

A negative charge pump may be used to generate a negative voltage to provide negative logic control signals for DAC 116. The negative charge pump may be located within the multiplexer cell 110 or may be located within other circuit components including, but not limited to, circuit structures such as a bias voltage generator or DAC 116.

The multiplexer cell 110 depicted in FIG. 2 (described in conjunction with FIG. 1) is provided to ensure that than neither of first and second transmission gate devices 300, 302 has more than 1.8V voltage difference at any transistor terminal during circuit operation. For example, this may be accomplished by connecting coupling node 322 to gate 326a of P-channel transistor MPC and gate 326b of n-channel transistor MNC, and further coupling these elements to VSS. This ensures reliability and stress free operation of the multiplexer cell 110. Stress may occur when a transistor is subjected to a voltage that exceeds the designated maximum voltage rating of the transistor by a certain amount, potentially causing reliability and device aging issues. In some extreme cases, the subjected voltage may exceed the breakdown voltage of the transistor. Such high voltages may cause current to flow through the insulator materials of the transistor, causing them to become electrically conductive, possibly causing permanent damage to the transistor.

As detailed above, multiplexer cell 110 is controlled by DAC 116 via logic control node 104. Depending on the address input 118, DAC 116 provides a control (e.g., select) signal to logic control node 104 that has a high or low logic level. In one example, the high logic level is a voltage of about 1.8V and the low logic level is a voltage of about 0V. In another example, the high logic level is a voltage of about 0V and the low logic level is a voltage of about −1.8V. These logic levels control the operation of first voltage generator 102 and multiplexer cell 110 within half range biasing voltage circuit structure 100.

During normal logic operations, p-channel transistors are enabled/on when gated to a low logic level and disabled/off when gated to a high voltage/logic level. Alternatively, n-channel transistors are enabled/on when gated to a high voltage/logic level and are disabled/off when gated to a low logic level. To this extent, depending on whether the control signal provided by DAC 116 to logic control node 104 is high or low, multiplexer cell 110 will perform two different operations.

Figure 3:
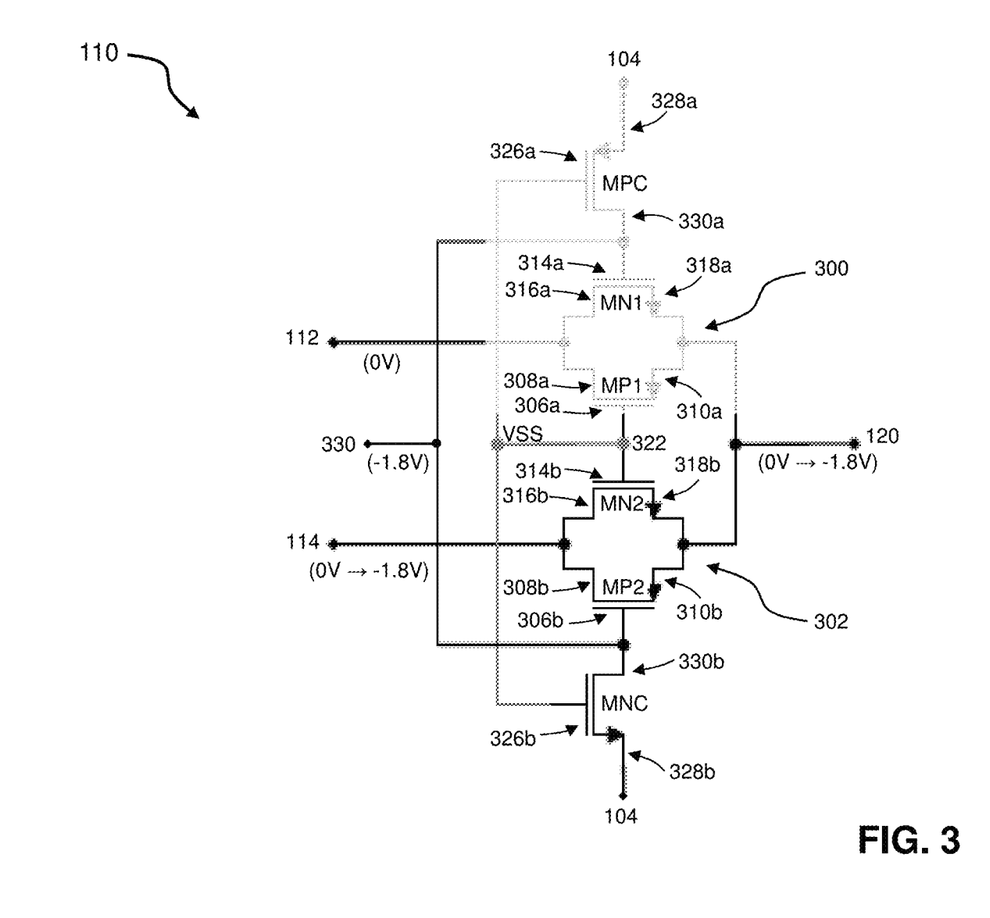
FIG. 3 shows a schematic view of the multiplexer cell circuit structure of FIG. 2 configured to multiplex a negative voltage to the voltage output according to embodiments.

The first operation of multiplexer cell 110, depicted in FIG. 3, occurs when a negative voltage, for example in the range of about 0V to −1.8V, is desired at output node 120. In this case, DAC 116 generates a −1.8V enabling logic control signal to MUX 110 which, through a voltage level shifting conversion circuit, is provided to the source terminal 328a of p-channel transistor MPC and source terminal 328b of n-channel transistor MNC. This −1.8V enabling logic control signal, at logic control node 104, is also provided to first voltage generator 102 (FIG. 1). In response to this control signal, first voltage generator 102 generates a voltage of about 0V at input 112 of multiplexer cell 110 and a voltage of about 0V to −1.8V at second input 114 of multiplexer cell 110.

Coupling node 322 is physically connected to a voltage of about 0V (VSS), which is applied to gate 306a of p-channel transistor MP1 of first transmission gate device 300 and to gate 314b of n-channel transistor MN2 of second transmission gate device 302. While a 0V voltage is arguably low, it is considered a high logic level when the effective voltage level for this operation mode is about −1.8V to about 0V. Similarly −1.8V is considered a low logic level for this operation mode. As a result, n-channel transistor MN2 of second transmission gate device 302 is enabled and p-channel transistor MP1 of first transmission gate device 300 is disabled. The voltage at coupling node 322 is also coupled to gate 326a of p-channel transistor MPC (disabling MPC) and to gate 326b of n-channel transistor MNC (enabling MNC). As a result, coupling node 330 is pulled down to −1.8V, which is applied at gate 314a of n-channel transistor MN1 and gate 306b of p-channel transistor MP2. In summary, as depicted in FIG. 3, n-channel transistor MNC, and n-channel transistor MN2 and p-channel transistor MP2 of second transmission gate device 302, are enabled, while p-channel transistor MPC, and n-channel transistor MN1 and p-channel transistor MP1 of first transmission gate device 300, are disabled (shown in phantom in FIG. 3), thereby disabling first transmission gate device 300. A negative voltage ranging from about 0V to −1.8V is thus provided from second input 114 through second transmission gate device 302 to output node 120 of multiplexer cell 110.

Figure 4:
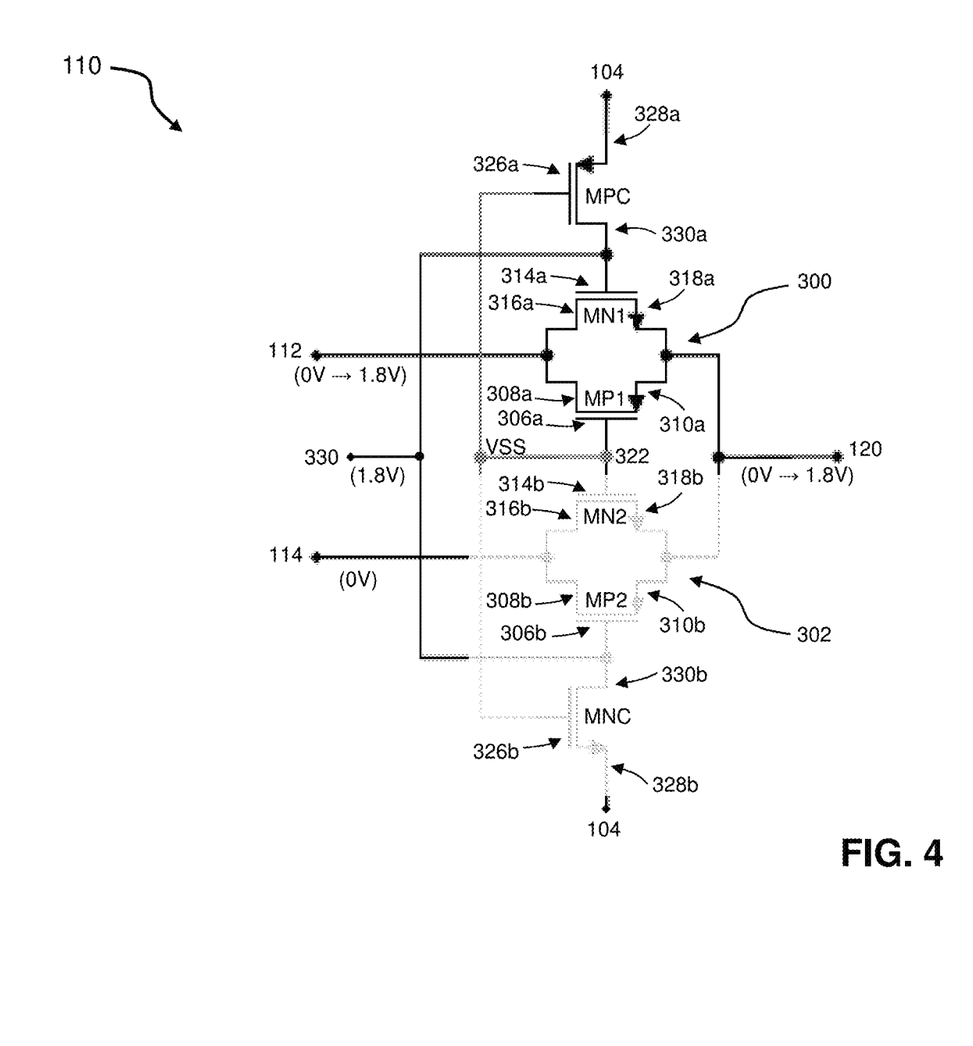
FIG. 4 shows a schematic view of the multiplexer cell circuit structure of FIG. 2 configured to multiplex a positive voltage to the voltage output according to embodiments.

The second operation multiplexer cell 110, depicted in FIG. 4, occurs when a positive voltage, in the range of about 0V to 1.8V is desired at output node 120. In this case, DAC 116 generates a 1.8V enabling logic control signal to MUX 110 which, through a voltage level shifting conversion circuit, is provided to the source terminal 328a of p-channel transistor MPC and source terminal 328b of n-channel transistor MNC. This 1.8V enabling logic control signal, at control node 104, is also provided to first voltage generator 102 (FIG. 1). In response to this control signal, first voltage generator 102 generates a voltage of about 0V to 1.8V at input 112 of multiplexer cell 110 and a voltage of about 0V at second input 114 of multiplexer cell 110.

As coupling node 322 is connected to a voltage of about 0V (VSS), this voltage is applied to gate 306a of p-channel transistor MP1 of first transmission gate device 300 and to gate 314b of n-channel transistor MN2 of second transmission gate device 302. In this case, the voltage VSS (0V) at coupling node 322 is considered a low logic level when the effective voltage level for this operation mode is about 0V to about 1.8V. Also, 1.8V is considered a high logic level for this operation mode. As a result, n-channel transistor MN2 of second transmission gate device 302 is disabled and p-channel transistor MP1 of first transmission gate device 300 is enabled. The voltage at coupling node 322 is also coupled to gate 326a of p-channel transistor MPC (enabling MPC) and to gate 326b of n-channel transistor MNC (disabling MNC). As a result, coupling node 330 is pulled up to about 1.8V which is applied at gate 314a of n-channel transistor MN1 and gate 306b of p-channel transistor MP2. In summary, n-channel transistor MNC, and n-channel transistor MN2 and p-channel transistor MP2 of second transmission gate device 302, are now disabled, thereby disabling second transmission gate device 302 (shown in phantom in FIG. 4), while p-channel transistor MPC, and n-channel transistor MN1 and p-channel transistor MP1 of first transmission gate device 300, are enabled. A positive voltage ranging from about 0V to 1.8V is thus provided from first input 112 through first transmission gate device 300 to output node 120 of multiplexer cell 110.

The first and second operations of multiplexer cell 110 allow for back-gated transistors, such as FD-SOI transistors, to be precisely controlled with any specific voltage ranging from −1.8V to 1.8V. In addition, first and second operations of multiplexer cell 110 control whether the back-gate biased transistors are FBB, RBB, or operate at normal operation at output node 120. As explained above, the maximum voltage level across any transistor terminal is about 1.8V, which in this embodiment is also the supply voltage level VDDH (see, FIG. 5), resulting in stress free operation under all conditions.

Figure 5:
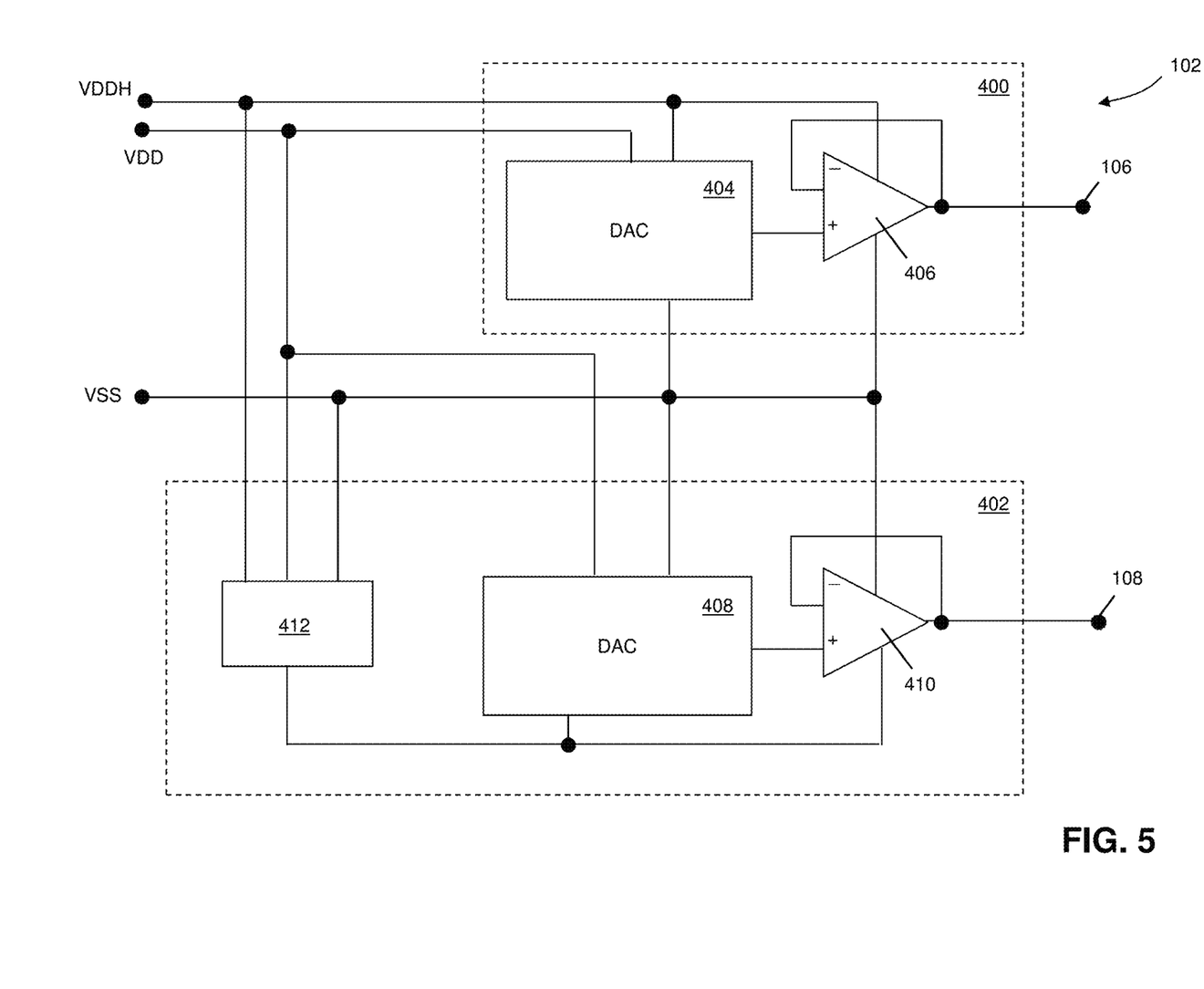
FIG. 5 shows a schematic view of a half range voltage generator configured to produce a positive and negative voltage to a multiplexer cell according to embodiments.

Turning to FIG. 5, a schematic view of the first voltage generator 102 according to embodiments is shown. First voltage generator 102 includes a positive voltage generator 400 for generating a positive voltage at positive voltage node 106 and a negative voltage generator 402 for generating a negative voltage at negative voltage node 108. Positive voltage generator 400 further includes a voltage DAC 404 coupled to a buffer 406, while negative voltage generator 402 further includes a voltage DAC 408 coupled to a buffer 410. The voltage DACs 404, 408 may include a 3-bit DAC, 4-bit DAC, 5-bit DAC, etc., or any other suitable DAC capable of generating a desired voltage. Buffer 406 and buffer 410 may be implemented using, for example, a unity gain buffer or any other suitable buffer.

Voltage DAC 404 of positive voltage generator 400 and voltage DAC 408 of negative voltage generator 408 are each coupled to logic control node 104. Buffer 406 of positive voltage generator 400 is output to positive voltage node 106 allowing for the generated positive voltage to pass into multiplexer cell 110 via first input 112. Buffer 410 of negative voltage generator 402 is output to negative voltage node 108 further allowing for the generated negative voltage to pass into multiplexer cell 110 via second input 114. Unlike positive voltage generator 400, negative voltage generator 402 may further includes a negative charge pump 412 coupled to voltage DAC 408 and buffer 410. Adding negative charge pump 412 to negative voltage generator 402 allows negative voltage generator 402 to provide the necessary negative voltage on demand. Positive voltage generator 400 and negative voltage generator 402 may each utilize two voltage supplies: core voltage supply VDD and higher power supply VDDH. Core voltage supply VDD may aid in controlling the inner logic associated with positive and negative voltage generators 400, 402. Alternatively, higher power supply VDDH is the initial source of voltage used by positive and negative voltage generators 400, 402 to generate positive and negative voltages provided at positive and negative voltage nodes 106, 108. In another embodiment, higher voltage power supply VDDH can be generated internally by using a positive charge pump (not shown) resulting in core voltage supply VDD being the only external voltage source.

During circuit operation, positive voltage generator 400 and negative voltage generator 402 may simultaneously generate positive and negative voltages at first and second inputs 112, 114 of multiplexer cell 110. Alternatively, depending on address input 118 (FIG. 1) provided to 116, DAC 116 may logically control via logic control node 104 whether voltage generator 400 and negative voltage regulator 402 are both enabled, or if one of positive voltage generator 400 and negative voltage generator 402 is enabled and the other disabled. This operation allows for only positive or negative voltages to be produced when desired. This operation may reduce power consumption and increase circuit efficiency.

Figure 6:
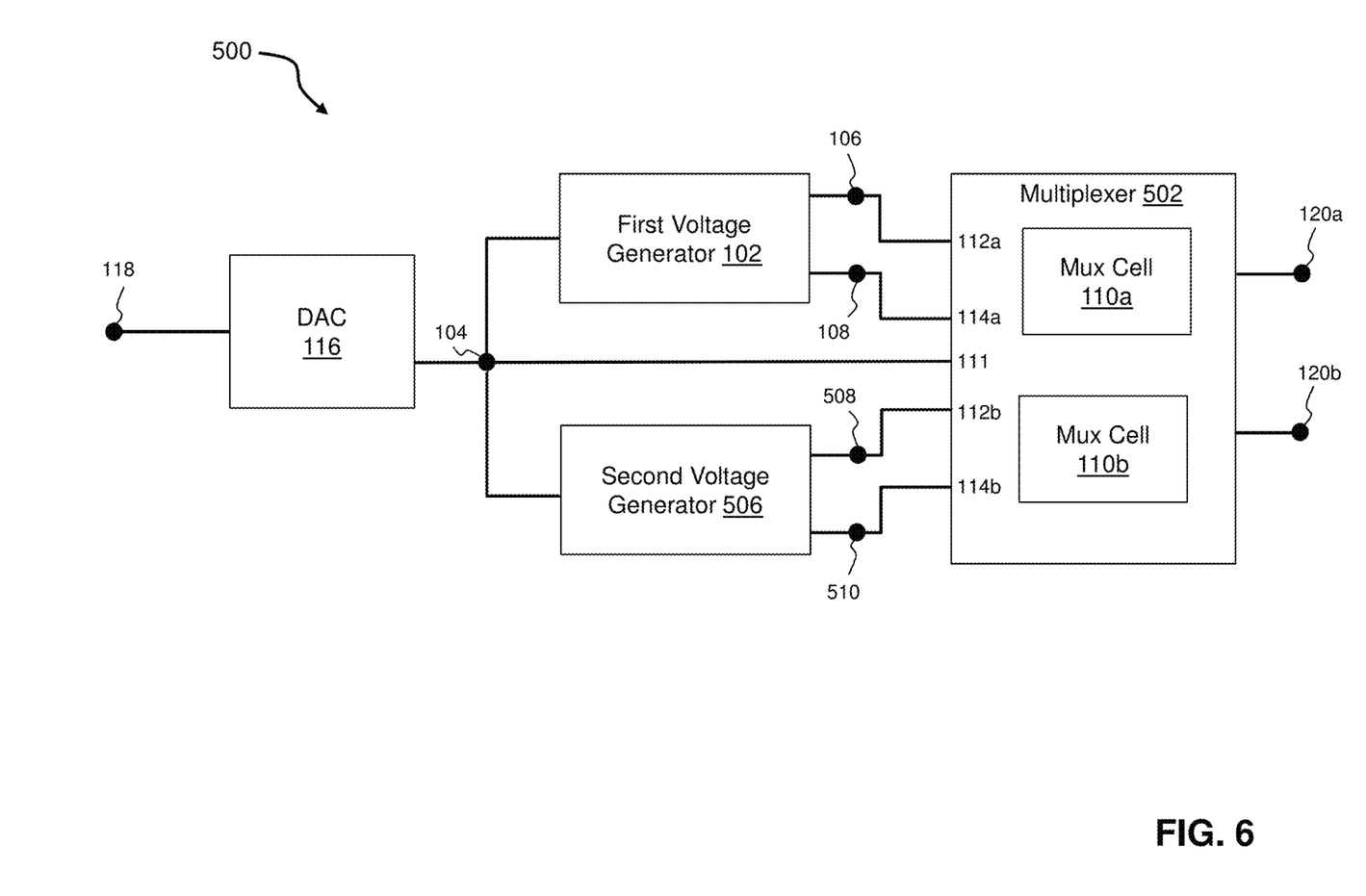
FIG. 6 shows a schematic view of a full range back-gate bias generator circuit structure according to embodiments.

Turning to FIG. 6, a schematic view of a full range back-gate bias generator circuit structure 500 according to embodiments is shown. Circuit structure 500 includes multiplexer 502, first voltage generator 102, and second voltage generator 506, which are all coupled to logic control node 104. Second voltage generator 506 may have the same configuration as first voltage generator 102, or may have any other configuration suitable for generating the voltages described herein. First voltage generator 102 is configured to generate positive and negative voltages at positive and negative voltage nodes 106, 108, respectively. Similarly, second voltage generator 506 is configured to generate positive and negative voltages at positive and negative voltage nodes 508, 510, respectively.

Multiplexer 502 includes at least a first multiplexer cell 110a and a second multiplexer cell 110b, each having the same configuration and structure as multiplexer cell 110. First and second multiplexer cells 110a 110b may be coupled together or may be separate, distinct circuit structures. First and second multiplexer cells 110a and 110b are also each coupled to logic control node 104. Multiplexer cell 110a may be configured to receive a positive voltage from positive voltage node 106 via first input 112a and a negative voltage from negative voltage node 108 via second input 114a. Multiplexer cell 110b may be configured to receive a positive voltage from positive voltage node 508 via first input 112b and a negative voltage from negative voltage node 510 via second input 114b. Multiplexer cells 110a and 110b perform the same function as discussed above with regard to multiplexer cell 110. Multiplex cell 110a may multiplex first and second inputs 112a, 114a to yield a single output at first output node 120a, while multiplex cell 110b may multiplex first and second inputs 112b, 114b to yield a single output at second output node 120b.

In another embodiment, multiplexer cell 110a may multiplex first input 112a of multiplexer cell 110a and second input 114b of multiplexer cell 110b. Similarly, in another embodiment, multiplexer cell 110a may also multiplex second input 114a of multiplexer cell 110a and first input 112b of multiplex cell 110b. In yet another embodiment, multiplexer cell 110b may multiplex first input 112a of multiplexer cell 110a and second input 114b of multiplexer cell 110b. Similarly, in another embodiment, multiplexer cell 110b may also multiplex second input 114a of multiplexer cell 110a and first input 112b of multiplex cell 110b. As discussed herein, DAC 116 is configured to logically control first voltage generator 102, second voltage generator 506, and multiplexer cells 110a, 110b of multiplexer 502 based on the address input 118 to DAC 116.

While the embodiment shown in FIG. 6 allows for a full-range of back-gate biasing voltages ranging from about −1.8V to about 1.8V, this may create potential problems when working with different substrate polarities. As discussed above in reference to FD-SOI transistors, the back-gate biasing voltage is applied to the substrate of the FD-SOI transistor. Such substrates can have different polarities that can change their electrical characteristics and how the transistor functions, specifically what voltages result in FBB and RBB. As such, full range back-gate bias generator circuit structure 500 provides a first output node 120a, from multiplexer cell 110a, configured to provide a full-range of biasing voltages ranging from about −1.8V to about 1.8V to devices not only having a back-gate terminal, but also devices having p-well or n-well substrates. Full range back-gate bias generator circuit structure 500 further provides a second output node 120b, from multiplexer cell 110b, configured to provide a full-range of biasing voltages ranging from about −1.8V to about 1.8V to devices not only having a back-gate terminal, but also devices having p-well or n-well substrates. As such, full range back-gate bias generator circuit structure 500 is capable of providing any back-gate biasing needed to any transistor type regardless of the internal components of the transistors. As an example, output node 120a can be used to provide back-bias voltage to NMOS transistor devices and output node 120b can be used to provide back-bias voltage to PMOS transistors devices at the same time. It may be noted that both output nodes 120a and 120b can be interchanged, in above example, without any loss of functionality. These embodiments can increase the utility of circuit structures using back-gated transistors, such as FD-SOI. As discussed above, by providing a single output configured to produce a range of back-gate biasing voltages, ranging from about −1.8V to 1.8V allows the simultaneously biasing of transistors to operate in either FBB, normal operation, or RBB. Each operation offers distinct benefits offering faster and more energy efficient circuit structures.

The following description describes various embodiments of a circuit structure used within a voltage divider topology. Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A circuit structure for producing a biasing voltage range, the circuit structure comprising:
   a logic control node;
   a first voltage generator and a second voltage generator, coupled to the logic control node, the first voltage generator configured to generate a positive voltage output at a first positive voltage node and a negative voltage output at a first negative voltage node, the second voltage generator configured to generate a positive voltage output at a second positive voltage node and a negative voltage output at a second negative voltage node;
   a first multiplexer cell and a second multiplexer cell, coupled to the logic control node, wherein the first and the second multiplexer cells are configured to multiplex the positive voltage level received from the first or the second positive voltage node and the negative voltage level received from the first or the second negative voltage node to provide a multiplexed output;
   an output node coupled to the first multiplexer cell and configured to receive the multiplexed output to provide the biasing voltage range to at least one transistor having a back-gate terminal;
   an output node coupled to the second multiplexer cell and configured to receive the multiplexed output to provide the biasing voltage range to at least one transistor having a back-gate terminal; and
   a digital-to-analog converter (DAC) coupled to the logic control node and configured to logically control the first and the second voltage generators and the first and the second multiplexer cells to produce the biasing voltage range.

2. The structure of claim 1, wherein the first and the second multiplexer cells each further comprise:
   a first transmission gate device and a second transmission gate device,
   wherein the first transmission gate device includes:
      a p-channel transistor having a gate, a drain, and a source; and
      an n-channel transistor having a gate, a drain, and a source,
   wherein the n-channel transistor and the p-channel transistor are source coupled to the output node and drain coupled to a first input node; and
   wherein the second transmission gate device includes:
      a p-channel transistor having a gate, a drain, and a source; and
      an n-channel transistor having a gate, a drain, and a source,
   wherein the n-channel transistor and the p-channel transistor are source coupled to the output node and drain coupled to a second input node;
   wherein the p-channel transistor of the first transmission gate device and the n-channel transistor of the second transmission gate device are gate coupled to a coupling node.

3. The structure of claim 2, wherein the first and the second multiplexer cells each further comprise a first and second radial transistor, each of the first and second radial transistors having a gate, a source, and a drain, wherein the drain of the first radial transistor is coupled to the gate of the n-channel transistor of the first transmission gate device, and wherein the drain of the second radial transistor is coupled to the gate of the p-channel transistor of the second transmission gate device and the source of the first radial transistor and the source of the second radial transistor are coupled to the logic control node.

4. The structure of claim 3, wherein each of the gates of the first and second radial transistors are coupled to the coupling node.

5. The structure of claim 2, wherein the coupling node is coupled to a zero voltage supply or VSS (ground) pin.

6. The structure of claim 2, wherein a maximum voltage applied to the p-channel transistor and the n-channel transistor of the first transmission gate device and applied to the p-channel transistor and the n-channel transistor of the second transmission gate device does not exceed a voltage of about 1.8V.

7. The structure of claim 1, wherein the first and the second voltage generators each further include a positive voltage generator configured to generate a positive voltage and a negative voltage generator configured to generate a negative voltage.

8. The structure of claim 7, wherein each of the positive and negative voltage generators has a DAC coupled to a buffer, wherein each of the DACs are coupled to the logic control node and each of the buffers are coupled to the positive and negative voltage nodes, respectively.

9. The structure of claim 8, wherein the negative voltage generator further includes a negative voltage charge pump coupled to the DAC of the negative voltage generator.

10. The structure of claim 1, wherein the biasing voltage range further includes a forward back-gate biasing voltage range and a reverse back-gate biasing voltage range for the at least one transistor having the back-gate terminal.

11. A method of producing a biasing voltage range, the method comprising:
generating a positive and a negative voltage from first and second voltage generators, wherein the first and second voltage generators are each coupled to a logic control node, a positive voltage node, and a negative voltage node;
using first and second multiplexer cells coupled to the logic control node, multiplexing the positive voltage available from the positive voltage node and the negative voltage available from the negative voltage node to produce a multiplexed output;
coupling an output node to the first multiplexer cell to receive the multiplexed output to provide the biasing voltage range to at least one transistor having a back-gate terminal;
coupling an output node to the second multiplexer cell to receive the multiplexed output to provide the biasing voltage range to at least one transistor having a back-gate terminal; and
logically controlling the first and the second voltage generators and the first and the second multiplexer cells with a digital-to-analog converter (DAC) coupled to the logic control node to produce the biasing voltage range.

12. The method of claim 11, wherein the first and the second multiplexer cells each further include:
a first and second transmission gate device,
wherein the first transmission gate device includes:
a p-channel transistor having a gate, a drain, and a source; and
an n-channel transistor having a gate, a drain, and a source,
wherein the n-channel and p-channel transistors are source coupled to the output node and drain coupled to a first input node; and
wherein the second transmission gate device includes:
a p-channel transistor having a gate, a drain, and a source; and
an n-channel transistor having a gate, a drain, and a source,
wherein the n-channel and p-channel transistors are source coupled to the output node and drain coupled to a second input node;
wherein the p-channel transistor of the first transmission gate device and the n-channel transistor of the second transmission gate device are gate coupled to a coupling node.

13. The method of claim 12, wherein the first and the second multiplexer cells each further includes first and second radial transistors, each of the first and second radial transistors having a gate, a source, and a drain, wherein the drain of the first radial transistor is coupled to the gate of the n-channel transistor of the first transmission gate device, and wherein the drain of the second radial transistor is coupled to the gate of the p-channel transistor of the second transmission gate device and the source of the first radial transistor and the source of the second radial transistor are coupled to the logic control node.

14. The method of claim 13, wherein each of the gates of the first and second radial transistors are coupled to the coupling node connected to zero voltage source or VSS (ground) pin.

15. The method of claim 12, wherein a maximum voltage applied to the p-channel transistor and the n-channel transistor of the first transmission gate device and applied to the p-channel transistor and the n-channel transistor of the second transmission gate device does not exceed a voltage of about 1.8V.

16. The method of claim 11, wherein the DAC further includes an address input, wherein the address input determines whether the first or the second voltage generator produces either a positive voltage or a negative voltage.

17. The method of claim 11, wherein the biasing voltage range further includes a forward back-gate biasing voltage range and a reverse back-gate biasing voltage range for the at least one transistor having the back-gate terminal.

18. A circuit structure for producing a biasing voltage range, the circuit structure comprising:
a logic control node;
a first voltage generator and a second voltage generator, coupled to the logic control node, the first voltage generator configured to generate a positive voltage output at a first positive voltage node and a negative voltage output at a first negative voltage node, the second voltage generator configured to generate a positive voltage output at a second positive voltage node and a negative voltage output at a second negative voltage node;
a first multiplexer cell and a second multiplexer cell, coupled to the logic control node, wherein the first and the second multiplexer cells are configured to multiplex the positive voltage level received from the first or the second positive voltage node and the negative voltage level received from the first or the second negative voltage node to provide a multiplexed output;
a first output node coupled to the first and the second multiplexer cells and configured to receive the multiplexed output to provide the biasing voltage range to at least one transistor having a back-gate terminal;
a second output node coupled to the first and the second multiplexer cell and configured to receive the multiplexed output to provide the biasing voltage range to at least one transistor having a back-gate terminal; and
a logic control digital-to-analog converter (DAC) coupled to the logic control node and configured to logically control the first voltage generator, the second voltage generator, the first multiplexer cell, and the second multiplexer cell, to produce the biasing voltage range at each the first output node and the second output node.

19. The structure of claim 18, wherein the biasing voltage range further includes a forward back-gate biasing voltage range and a reverse back-gate biasing voltage range for the at least one transistor having the back-gate terminal.

\* \* \* \* \*